United States Patent
Furusawa et al.

(10) Patent No.: US 11,444,222 B2
(45) Date of Patent: Sep. 13, 2022

(54) NITRIDE SEMICONDUCTOR LIGHT-EMITTING ELEMENT AND PRODUCTION METHOD FOR NITRIDE SEMICONDUCTOR LIGHT-EMITTING ELEMENT

(71) Applicant: NIKKISO CO., LTD., Tokyo (JP)

(72) Inventors: Yuta Furusawa, Ishikawa (JP); Mitsugu Wada, Ishikawa (JP); Yusuke Matsukura, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 178 days.

(21) Appl. No.: 16/645,906

(22) PCT Filed: Jul. 31, 2018

(86) PCT No.: PCT/JP2018/028653
§ 371 (c)(1),
(2) Date: Mar. 10, 2020

(87) PCT Pub. No.: WO2019/054069
PCT Pub. Date: Mar. 21, 2019

(65) Prior Publication Data
US 2020/0279971 A1 Sep. 3, 2020

(30) Foreign Application Priority Data
Sep. 12, 2017 (JP) .............................. JP2017-174850

(51) Int. Cl.
*H01L 33/06* (2010.01)
*H01L 33/00* (2010.01)
(Continued)

(52) U.S. Cl.
CPC ............ *H01L 33/007* (2013.01); *H01L 33/06* (2013.01); *H01S 5/2206* (2013.01); *H01S 5/2216* (2013.01); *H01S 5/3216* (2013.01)

(58) Field of Classification Search
CPC ..... H01L 33/007; H01L 33/06; H01S 5/2206; H01S 5/2216; H01S 5/3216
See application file for complete search history.

(56) References Cited

U.S. PATENT DOCUMENTS

| 4,839,899 A | 6/1989 | Burnham et al. |
| 5,679,965 A | 10/1997 | Schetzina |

(Continued)

FOREIGN PATENT DOCUMENTS

| CN | 103855262 A | 6/2014 |
| JP | 62-123789 A | 6/1987 |

(Continued)

OTHER PUBLICATIONS

Notification of Reasons for Refusal dated Apr. 7, 2020 received from the Japanese Patent Office in related application 2018-156041 together with English language translation.

(Continued)

*Primary Examiner* — Bradley Smith
(74) *Attorney, Agent, or Firm* — Scully, Scott, Murphy & Presser, PC

(57) ABSTRACT

A nitride semiconductor light-emitting element includes an n-type cladding layer including n-type AlGaN and having a first Al composition ratio, and a multiple quantum well layer in which a plurality (number N) of barrier layers including AlGaN having a second Al composition ratio more than the first Al composition ratio and a plural (number N) well layers having an Al composition ratio less than the second Al composition ratio are stacked alternately in this order, wherein the second Al composition ratio of the plurality of (Continued)

barrier layers of the multiple quantum well layer increases at a predetermined increase rate from an n-type cladding layer side toward an opposite side to the n-type cladding layer side.

5 Claims, 3 Drawing Sheets

(51) Int. Cl.
  *H01S 5/22* (2006.01)
  *H01S 5/32* (2006.01)

(56) References Cited

U.S. PATENT DOCUMENTS

| | | |
|---|---|---|
| 7,122,839 B2 | 10/2006 | Shen et al. |
| 7,577,172 B2 | 8/2009 | Tandon et al. |
| 7,649,195 B2 | 1/2010 | Lee et al. |
| 8,975,616 B2 | 3/2015 | Wang et al. |
| 9,196,788 B1 | 11/2015 | Wierer et al. |
| 9,583,671 B2 | 2/2017 | Wang et al. |
| 10,020,421 B2 | 7/2018 | Eichler et al. |
| 2006/0091404 A1 | 5/2006 | Shen et al. |
| 2006/0274801 A1 | 12/2006 | Tandon et al. |
| 2007/0181869 A1 | 8/2007 | Gaska et al. |
| 2008/0308787 A1* | 12/2008 | Lee .................. H01L 33/06 257/E33.028 |
| 2009/0179221 A1 | 7/2009 | Han |
| 2014/0008607 A1 | 1/2014 | Wang et al. |
| 2015/0372189 A1* | 12/2015 | Matsuura ........... H01S 5/3407 257/13 |
| 2017/0373220 A1 | 12/2017 | Eichler et al. |
| 2019/0006558 A1 | 1/2019 | Watanabe et al. |
| 2020/0006599 A1 | 1/2020 | Watanabe et al. |
| 2021/0193874 A1* | 6/2021 | Watanabe .......... H01L 33/06 |

FOREIGN PATENT DOCUMENTS

| | | |
|---|---|---|
| JP | H5-102604 A | 4/1993 |
| JP | H7-235732 A | 9/1995 |
| JP | 2002-270894 A | 9/2002 |
| JP | 2003-31902 A | 1/2003 |
| JP | 2003-520453 A | 7/2003 |
| JP | 2008-166712 A | 7/2008 |
| JP | 2008-311658 A | 12/2008 |
| JP | 2013-118412 A | 6/2013 |
| JP | 5296290 B2 | 9/2013 |
| JP | 5521068 B1 | 6/2014 |
| JP | 2014-146731 A | 8/2014 |
| JP | 2017-28076 A | 2/2017 |
| JP | 2017-34036 A | 2/2017 |
| JP | 2019-50337 A | 3/2019 |
| KR | 10-2014-0099646 A | 8/2014 |
| WO | 2016/110433 A1 | 7/2016 |

OTHER PUBLICATIONS

International Search Report dated Sep. 4, 2018 issued in PCT/JP2018/028653.
JP Office Action dated May 8, 2018 issued in JP 2017-174850.
JP Office Action dated Feb. 6, 2018 issued in JP 2017-174850.
Notice of Reasons for Refusal dated Jul. 26, 2022 received from the Japanese Patent Office in related application 2021-149116 together with English language translation.

* cited by examiner

| No. | EMISSION WAVELENGTH (nm) | EMISSION OUTPUT (a. u.) |
|---|---|---|
| EXAMPLE 1 | 280.7 | 1.24 |
| EXAMPLE 2 | 283.3 | 1.28 |
| EXAMPLE 3 | 283.1 | 1.23 |
| EXAMPLE 4 | 281.7 | 1.25 |
| EXAMPLE 5 | 283.0 | 1.20 |
| COMPARATIVE EXAMPLE 1 | 279.8 | 0.74 |
| COMPARATIVE EXAMPLE 2 | 283.8 | 0.86 |

NITRIDE SEMICONDUCTOR LIGHT-EMITTING ELEMENT AND PRODUCTION METHOD FOR NITRIDE SEMICONDUCTOR LIGHT-EMITTING ELEMENT

TECHNICAL FIELD

The invention relates to a nitride semiconductor light-emitting element and a production method for nitride semiconductor light-emitting element.

BACKGROUND ART

In recent years, nitride semiconductor light-emitting elements such as light-emitting diodes or laser diodes which emit blue light have been put into practical use, and nitride semiconductor light-emitting elements with improved emission output have been under development (see Japanese Patent No. 5296290).

The nitride semiconductor light-emitting element described in Japanese Patent No. 5296290 has an n-type nitride semiconductor layer, a nitride semiconductor stacked structure formed by alternately layering, in the following order, a plural number N of barrier layers and a plural number N of well layers having a smaller band gap than the barrier layer, an MN guide layer, and a p-type nitride semiconductor layer.

In the nitride semiconductor light-emitting element described in Japanese Patent No. 5296290, the plural barrier layers have the same Al composition ratio which is higher than the Al composition ratio of the plural well layers.

CITATION LIST

Patent Literature

Japanese Patent No. 5296290

SUMMARY OF INVENTION

Technical Problem

In the meantime, when the Al composition ratio of the barrier layer is different from the Al composition ratio of the well layer, an electric field is generated at an interface between the barrier layer and the well layer due to the piezoelectric effect. This electric field causes non-uniformity of electronic structure in the plural well layers even when the plural barrier layers have the same Al composition ratio. This non-uniformity may cause a decrease in emission output of the nitride semiconductor light-emitting element.

It is an object of the invention to provide a nitride semiconductor light-emitting element of which emission output can be improved by preventing non-uniformity of electronic structure in plural well layers, and a production method for such a nitride semiconductor light-emitting element.

Solution to Problem

A nitride semiconductor light-emitting element according to an embodiment of the invention comprises an n-type cladding layer comprising n-type AlGaN and having a first Al composition ratio; and a multiple quantum well layer in which a plurality (number N) of barrier layers comprising AlGaN having a second Al composition ratio more than the first Al composition ratio and a plurality (number N) of well layers having an Al composition ratio less than the second Al composition ratio are stacked alternately in this order, wherein the second Al composition ratio of the plurality of barrier layers of the multiple quantum well layer increases at a predetermined increase rate from an n-type cladding layer side toward an opposite side to the n-type cladding layer side.

A production method for a nitride semiconductor light-emitting element in another embodiment of the invention comprises forming an n-type cladding layer comprising n-type AlGaN on a substrate; and forming a multiple quantum well layer in which a plurality (number N) of barrier layers comprising AlGaN having a second Al composition ratio more than the first Al composition ratio and a plurality (number N) of well layers having an Al composition ratio less than the second Al composition ratio are stacked alternately in this order, wherein the forming the plurality of barrier layers of the multiple quantum well layer is performed while increasing an Al feed rate at a predetermined increase rate from an n-type cladding layer side toward an opposite side to the n-type cladding layer side.

Advantageous Effects of Invention

According to an embodiment of the invention, it is possible to provide a nitride semiconductor light-emitting element of which emission output can be improved by preventing non-uniformity of electronic structure in plural well layers, and a production method for such a nitride semiconductor light-emitting element.

DESCRIPTION OF EMBODIMENT

Embodiment

An embodiment of the invention will be described in reference to FIGS. 1 to 3A, B. The embodiment below is described as a preferred example for implementing the invention. Although some part of the embodiment specifically illustrates various technically preferable matters, the technical scope of the invention is not limited to such specific aspects. In addition, a scale ratio of each constituent element in each drawing is not necessarily the same as the actual scale ratio of the nitride semiconductor light-emitting element.

Figure 1:
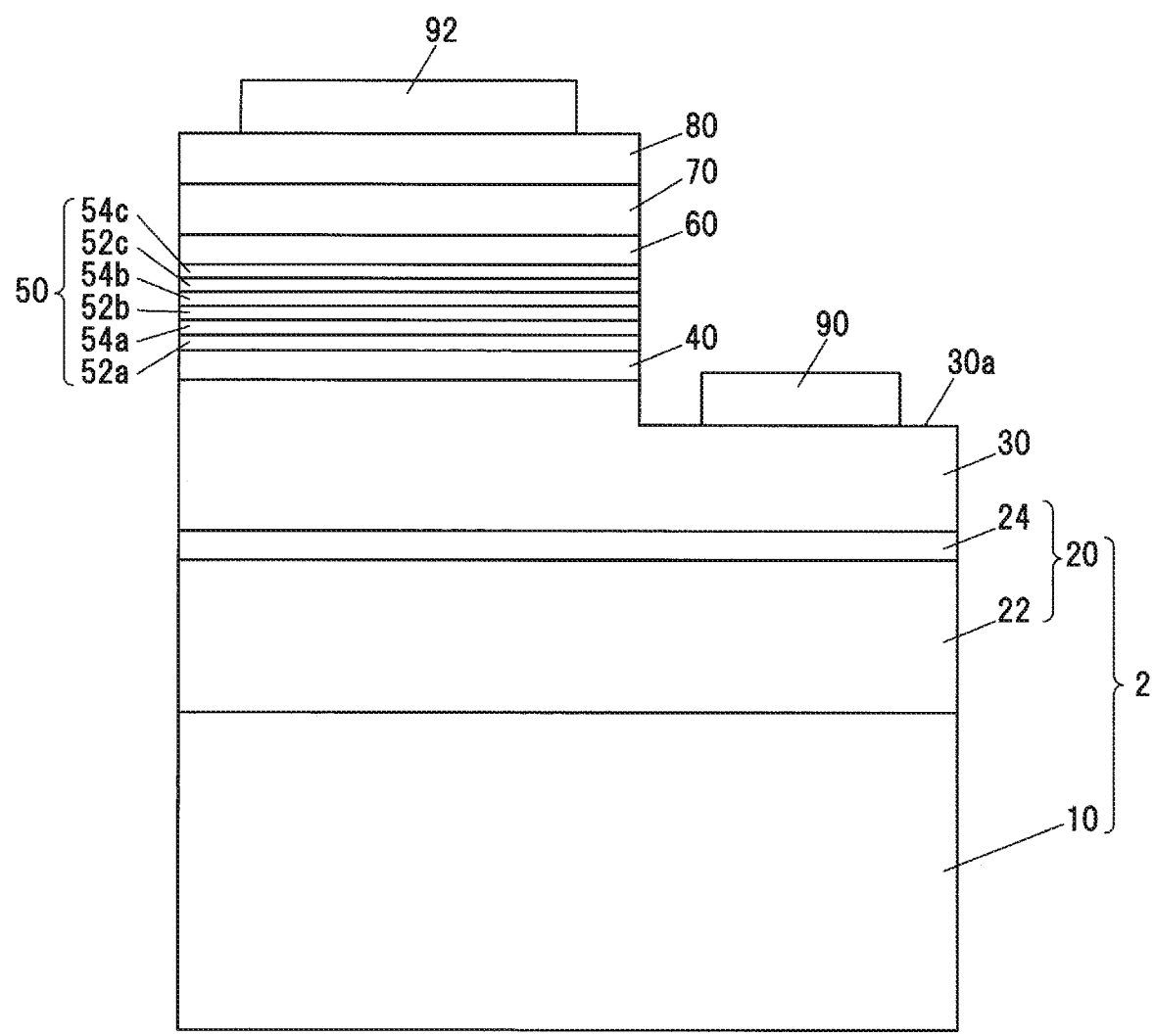
FIG. 1 is a schematic cross-sectional view showing an exemplary configuration of a nitride semiconductor light-emitting element in an embodiment of the present invention.

FIG. 1 is a schematic cross-sectional view showing an exemplary configuration of a nitride semiconductor light-emitting element in an embodiment of the invention. A nitride semiconductor light-emitting element 1 (hereinafter, also simply referred to as "light-emitting element 1") is a light-emitting diode (LED) which emits light with a wavelength in the ultraviolet region. In the present embodiment, the light-emitting element 1 emitting deep ultraviolet light with a central wavelength of 250 nm to 350 nm is specifically described as an example.

As shown in FIG. 1, the light-emitting element 1 includes a substrate 10, a buffer layer 20, an n-type cladding layer 30, a graded layer 40, a light-emitting layer 50 including a multiple quantum well layer, an electron blocking layer 60, a p-type cladding layer 70, a p-type contact layer 80, an n-side electrode 90 and a p-side electrode 92.

The semiconductor which can be used to form the light-emitting element 1 is, e.g., a binary, ternary, or quaternary group III nitride semiconductor which is expressed by $Al_xGa_yIn_{1-x-y}N$ ($0 \leq x \leq 1$, $0 \leq y \leq 1$, $0 \leq x+y \leq 1$). In addition, the group III elements thereof may be partially substituted with boron (B) or thallium (Tl), etc., and N may be partially substituted with phosphorus (P), arsenic (As), antimony (Sb) or bismuth (Bi), etc.

The substrate 10 is transparent to deep ultraviolet light emitted by the light-emitting element 1. The substrate 10 is formed to include, e.g., sapphire ($Al_2O_3$). Besides the sapphire ($Al_2O_3$) substrate, e.g., an aluminum nitride (AlN) substrate or an aluminum gallium nitride (AlGaN) substrate may be used as the substrate 10.

The buffer layer 20 is formed on the substrate 10. The buffer layer 20 includes an AlN layer 22 and a u-$Al_pGa_{1-p}N$ layer 24 ($0 \leq p \leq 1$) which is undoped and formed on the AlN layer 22. The substrate 10 and the buffer layer 20 constitute a foundation structure 2. The u-$Al_pGa_{1-p}N$ layer 24 may not be necessarily provided.

The n-type cladding layer 30 is formed on the foundation structure 2. The n-type cladding layer 30 is a layer formed of AlGaN with n-type conductivity (hereinafter, also simply referred to as "n-type AlGaN") and is, e.g., an $Al_qGa_{1-q}N$ layer ($0 \leq q \leq 1$) doped with silicon (Si) as an n-type impurity. Alternatively, germanium (Ge), selenium (Se), tellurium (Te) or carbon (C), etc., may be used as the n-type impurity. The n-type cladding layer 30 has a thickness of about 1 μm to 3 μm and is, e.g., about 2 μm in thickness. The n-type cladding layer 30 may be a single layer or may have a multilayer structure.

The graded layer 40 is formed on the n-type cladding layer 30. The graded layer 40 is a layer formed of n-type AlGaN and is, e.g., an $Al_zGa_{1-z}N$ layer ($0 \leq z \leq 1$) doped with silicon (Si) as an n-type impurity. The graded layer 40 has a thickness of about 1 to 100 nm and is, e.g., about 25 nm in thickness. The graded layer 40 is a layer which serves to control the interface between the n-type cladding layer 30 and a barrier layer 52a located on the n-type cladding layer side in the multiple quantum well layer (described later).

The light-emitting layer 50 including the multiple quantum well layer is formed on the graded layer 40. The light-emitting layer 50 is a layer including a multiple quantum well layer in which three $Al_rGa_{1-r}N$ barrier layers 52a, 52b, 52c, including the barrier layer 52a, and three $Al_sGa_{1-s}N$ well layers 54a, 54b, 54c ($0 \leq r \leq 1$, $0 \leq s \leq 1$, r>s, see FIG. 2) are stacked alternately in this order. The light-emitting layer 50 is configured to have a band gap of not less than 3.4 eV so that deep ultraviolet light with a wavelength of not more than 350 nm is output. The number N (N is a natural number) of the barrier layers 52 and of the well layers 54 is not necessarily limited to three, and may be two, or not less than four. In addition, in the following description, when any of the three barrier layers 52 needs to be specified and distinguished from the other barrier layers, the barrier layer 52 on the n-type cladding layer 30 side will be referred to as a first barrier layer 52a, the barrier layer 52 on the electron blocking layer 60 side will be referred to as a third barrier layer 52c, and the barrier layer 52 located between the first barrier layer 52a and the third barrier layer 52c will be referred to as a second barrier layer 52b.

Figure 2:
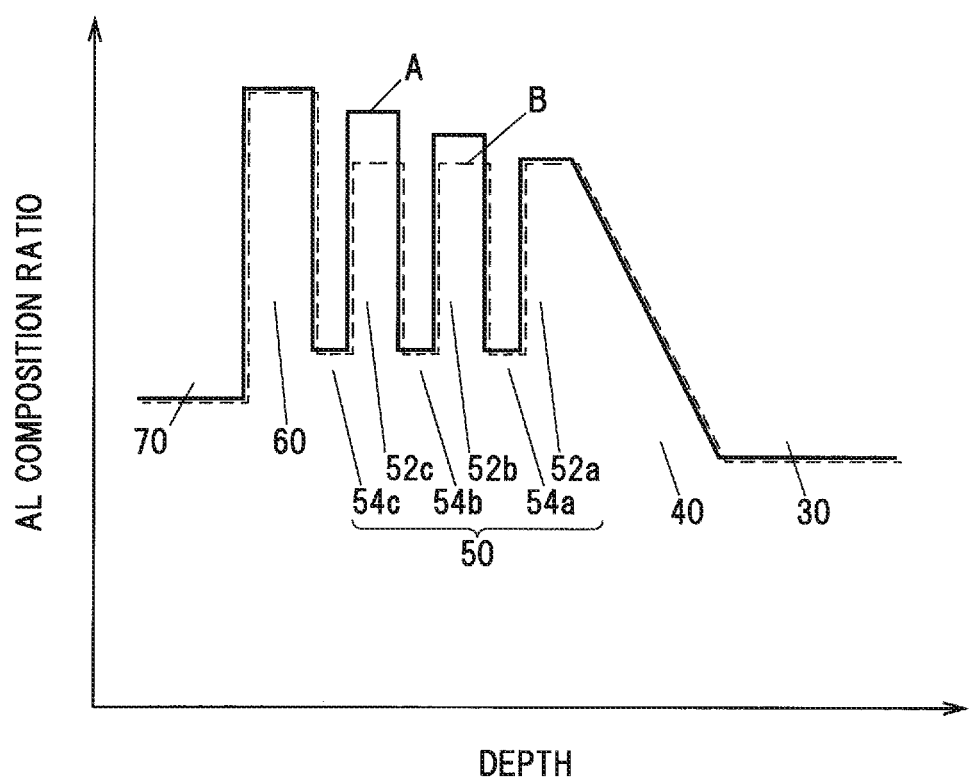
FIG. 2 is a graph schematically showing an Al composition ratio of the light-emitting element of the invention in comparison with an Al composition ratio of a conventional light-emitting element.

The following description will be given in reference to FIG. 2. FIG. 2 is a graph schematically showing the Al composition ratio of the light-emitting element 1 in comparison with the Al composition ratio of a conventional light-emitting element. The line labeled A in FIG. 2 shows the Al composition ratio of the light-emitting element 1 of the invention, and the line labeled B in FIG. 2 shows the Al composition ratio of the conventional light-emitting element. Here, "AlN mole fraction" (%) can be used as another expression for the Al composition ratio.

The Al composition ratio of the n-type cladding layer 30 is about 40% to 60%, preferably about 50% to 60%, more preferably about 54.6%.

The Al composition ratio of the graded layer 40 continuously increases from the n-type cladding layer 30 side toward the first barrier layer 52a. Preferably, the Al composition ratio of the graded layer 40 changes at a rate of about 1.0% increase per unit depth (nm) from the n-type cladding layer 30 side toward the first barrier layer 52a.

The Al composition ratio of the graded layer 40 is not limited to the ratio which increases diagonally and linearly, and may increase stepwisely or may increase diagonally and curvilinearly.

The Al composition ratio of each of the first to third barrier layers 52 is more than the Al composition ratio of the n-type cladding layer 30 and is, e.g., not less than 70%, preferably not less than 80%. The Al composition ratio of each of the first to third barrier layers 52a, 52b, 52c is an example of the second Al composition ratio.

In addition, the Al composition ratio of the barrier layer 52 has a value with which generation of the electric field due to the piezoelectric effect is prevented at the interface between the barrier layer 52 and the well layer 54. The Al composition ratio of the barrier layers 52 increases, e.g., sequentially from the n-type cladding layer 30 toward the side opposite to the n-type cladding layer 30 (i.e., toward the electron blocking layer 60). In detail, the Al composition ratio of the first to third barrier layers 52 increases in the order of the first barrier layer 52a, the second barrier layer 52b, and the third barrier layer 52c. In other words, the Al composition ratio of the second barrier layer 52b is more than that of the first barrier layer 52a, and the Al composition ratio of the third barrier layer 52c is more than that of the second barrier layer 52b.

In more detail, the Al composition ratio of the first to third barrier layers 52 increases at a predetermined increase ratio in the order of the Al composition ratio of the first barrier layer 52a, the Al composition ratio of the second barrier layer 52b and the Al composition ratio of the third barrier layer 52c. As an example, the Al composition ratio of the first barrier layer 52a is 82.0%, the Al composition ratio of the second barrier layer 52b is 82.9%, and the Al composition ratio of the third barrier layer 52c is 85.2%. In this case, the increase rate between the Al composition ratio of the first barrier layer 52a and the Al composition ratio of the second barrier layer 52b is 1.17% and the increase rate between the Al composition ratio of the second barrier layer 52b and the Al composition ratio of the third barrier layer 52c is 2.70%.

Alternatively, as another example, the Al composition ratio may be such that the Al composition ratio of the first barrier layer 52a is about 70.0%, the Al composition ratio of the second barrier layer 52b is about 73.0% and the Al composition ratio of the third barrier layer 52c is about 76.0%. In this case, the increase rate between the Al composition ratio of the first barrier layer 52a and the Al composition ratio of the second barrier layer 52b is 4.29% and the increase rate between the Al composition ratio of the second barrier layer 52b and the Al composition ratio of the third barrier layer 52c is 4.11%.

Alternatively, as yet another example, the Al composition ratio may be such that the Al composition ratio of the first barrier layer 52a is about 84.5%, the Al composition ratio of the second barrier layer 52b is about 85.3% and the Al composition ratio of the third barrier layer 52c is about 89.8%. In this case, the increase rate between the Al composition ratio of the first barrier layer 52a and the Al composition ratio of the second barrier layer 52b is 0.95% and the increase rate between the Al composition ratio of the second barrier layer 52b and the Al composition ratio of the third barrier layer 52c is 5.28%.

In other words, the second Al composition ratio of the plural barrier layers 52a, 52b, 52c of the multiple quantum well layer increases at an increase rate of 0.9% to 5.3% from the n-type cladding layer 30 toward the electron blocking layer 60. Preferably, the second Al composition ratio of the plural barrier layers 52a, 52b, 52c of the multiple quantum well layer increases at an increase rate of 1.1% to 2.7% from the n-type cladding layer 30 toward the electron blocking layer 60.

The electron blocking layer 60 is formed on the light-emitting layer 50. The electron blocking layer 60 is a layer formed of AlGaN with p-type conductivity (hereinafter, also simply referred to as "p-type AlGaN"). The electron blocking layer 60 has a thickness of about 1 nm to 10 nm. Alternatively, the electron blocking layer 60 may include a layer formed of AlN or may be formed of AlN not containing GaN. In addition, the electron blocking layer 60 is not necessarily limited to a p-type semiconductor layer and may be an undoped semiconductor layer.

The p-type cladding layer 70 is formed on the electron blocking layer 60. The p-type cladding layer 70 is a layer formed of p-type AlGaN and is, e.g., an $Al_tGa_{1-t}N$ cladding layer ($0 \leq t \leq 1$) doped with magnesium (Mg) as a p-type impurity. Alternatively, zinc (Zn), beryllium (Be), calcium (Ca), strontium (Sr) or barium (Ba), etc., may be used as the p-type impurity. The p-type cladding layer 70 has a thickness of about 300 nm to 700 nm and is, e.g., about 400 nm to 600 nm in thickness.

The p-type contact layer 80 is formed on the p-type cladding layer 70. The p-type contact layer 80 is, e.g., a p-type GaN layer doped with a high concentration of impurity such as Mg.

The n-side electrode 90 is formed on a certain region of the n-type cladding layer 30. The n-side electrode 90 is formed of, e.g., a multilayered film formed by sequentially stacking titanium (Ti), aluminum (Al), Ti and gold (Au) on the n-type cladding layer 30.

The p-side electrode 92 is formed on the p-type contact layer 80. The p-side electrode 92 is formed of, e.g., a multilayered film formed by sequentially stacking nickel (Ni) and gold (Au) on the p-type contact layer 80.

Next, a method for producing the light-emitting element 1 will be described. The buffer layer 20 is formed on the substrate 10. In detail, the MN layer 22 and the undoped u-$Al_pGa_{1-p}$N layer 24 are grown on the substrate 10 at high temperature. Next, the n-type cladding layer 30 is grown on the buffer layer 20 at high temperature. Then, the graded layer 40 is grown on the n-type cladding layer 30 at high temperature, e.g., at 1100° C., while adjusting the Al feed rate (e.g., increasing the Al composition ratio about 1.0±0.1% per unit depth (nm)).

Next, the light-emitting layer 50 is grown on the graded layer 40 at high temperature. In detail, the first barrier layer 52a, the well layer 54, the second barrier layer 52b, another well layer 54, the third barrier layer 52c and another well layer 54 are grown in this order on the graded layer 40 at high temperature. During the growth of the first to third barrier layers 52 on the graded layer 40, an appropriate adjustment is made so that the Al feed rate is increased consecutively.

Next, the electron blocking layer 60 and the p-type cladding layer 70 are sequentially grown on the light-emitting layer 50 at high temperature. The n-type cladding layer 30, the graded layer 40, the light-emitting layer 50, the electron blocking layer 60 and the p-type cladding layer 70 can be formed by a well-known epitaxial growth method such as Metal Organic Chemical Vapor Deposition (MOCVD), Molecular Beam Epitaxy (MBE), or Halide Vapor Phase Epitaxy (HVPE).

Next, a mask is formed on the p-type cladding layer 70. Then, in the exposed region in which the mask is not formed, the graded layer 40, the light-emitting layer 50, the electron blocking layer 60 and the p-type cladding layer 70 are removed. The graded layer 40, the light-emitting layer 50, the electron blocking layer 60 and the p-type cladding layer 70 can be removed by, e.g., plasma etching. The n-side electrode 90 is formed on an exposed surface 30a of the n-type cladding layer 30 (see FIG. 1), and the p-side electrode 92 is formed on the p-type contact layer 80 after removing the mask. The n-side electrode 90 and the p-side electrode 92 can be formed by, e.g., a well-known method such as electron beam evaporation method or sputtering method. The light-emitting element 1 shown in FIG. 1 is thereby obtained.

Figures 3A, 3B:
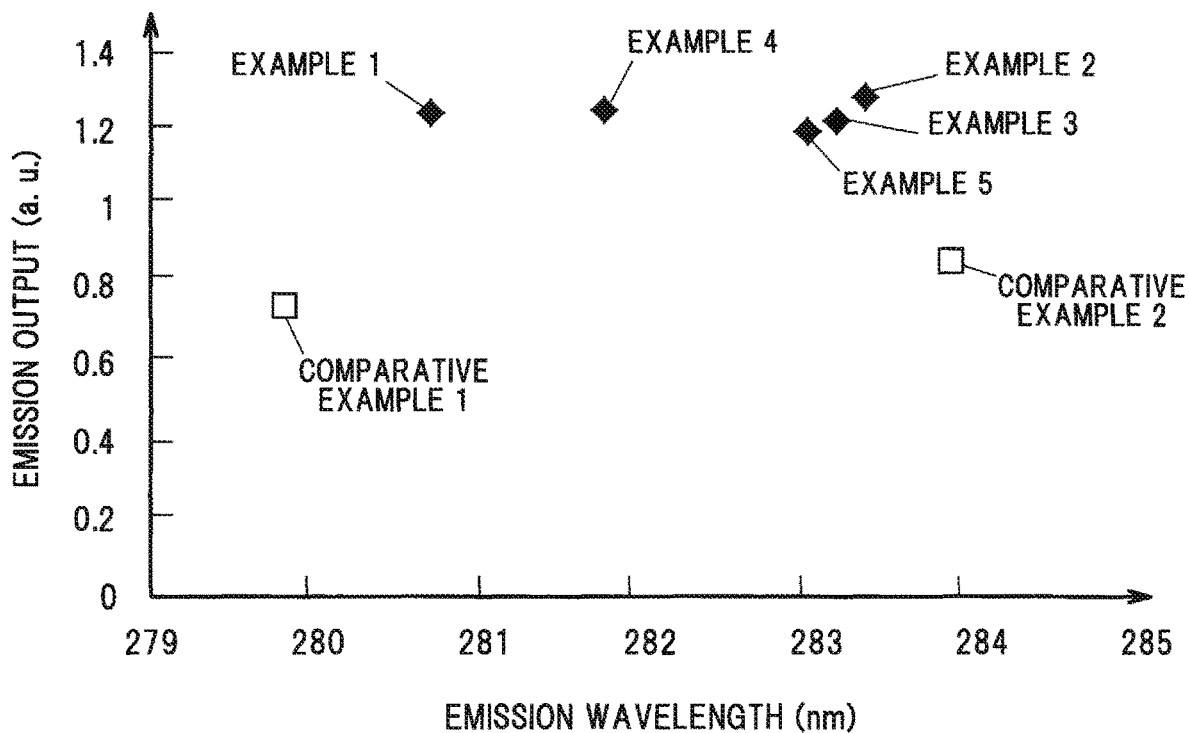
FIG. 3A is a table showing data of wavelength and emission output of light-emitting elements in Example and Comparative Examples.
FIG. 3B is a graph showing the results shown in FIG. 3A.

Next, Examples in the embodiment of the invention will be described in reference to FIGS. 3A and 3B. FIG. 3A is a table showing data of emission wavelength and emission output of light-emitting elements 1 in Examples 1 to 5 and Comparative Examples 1 and 2, and FIG. 3B is a graph showing the results shown in FIG. 3A. In the light-emitting elements 1 in Examples 1 to 5, the second Al composition ratio of the plural barrier layers 52a, 52b, 52c of the multiple quantum well layer increases in this order. In detail, the light-emitting elements 1 in Examples 1 to 5 are examples in which the Al composition ratio of the first barrier layer 52a is 82.0%, the Al composition ratio of the second barrier layer 52b is 82.9%, and the Al composition ratio of the third barrier layer 52c is 85.2%. Meanwhile, Comparative Examples 1 and 2 are conventional light-emitting elements 1 in which the second Al composition ratio of the plural barrier layers 52a, 52b, 52c of the multiple quantum well layer does not increase in this order at a predetermined increase rate.

Emission outputs (arbitrary unit) of the light-emitting elements 1 in Examples 1 to 5 and Comparative Examples 1 and 2 (in-house comparison) are shown in FIGS. 3A and 3B. Emission wavelength (nm) is a wavelength at which the measured emission output is obtained. In these Examples, as an example, the emission output was measured by a photodetector placed beneath the light-emitting elements 1 during when a current was supplied between the n-side electrode 90 and the p-side electrode 92 described above, even though various known methods can be used to measure the emission output.

As shown in FIG. 3A, in Example 1, an emission output of 1.24 was obtained at an emission wavelength of 280.7 nm. In Example 2, an emission output of 1.28 was obtained at an emission wavelength of 283.3 nm. In Example 3, an emission output of 1.23 was obtained at an emission wavelength of 283.1 nm. In Example 4, an emission output of 1.25 was obtained at an emission wavelength of 281.7 nm. In Example 5, an emission output of 1.20 was obtained at an emission wavelength of 283.0 nm.

In contrast to this, in Comparative Example 1, an emission output of 0.74 was obtained at an emission wavelength of 279.8 nm. In Comparative Example 2, an emission output of 0.86 was obtained at an emission wavelength of 283.8 nm.

In sum, the emission output was not less than 1.2 in all of Examples 1 to 5, while the emission output was less than 1.0 in both Comparative Examples 1 and 2. In addition, in all of Examples 1 to 5, the emission output was not less than 1.6 times the emission output in Comparative Example 1 and not less than 1.4 times the emission output in Comparative Example 2. It was found that emission output of the light-emitting element 1 is increased as described above.

Functions and Effects of the Embodiment

As described above, the light-emitting element 1 in the embodiment of the invention is provided with the light-emitting layer 50 which is configured that the Al composition ratio of the first to third barrier layers 52 increases in the order of the first barrier layer 52a, the second barrier layer 52b and the third barrier layer 52c. Due to this configuration, it is possible to increases the emission output of deep ultraviolet light of the light-emitting element 1. It is considered that, by providing barrier layers 52 with such an Al composition ratio, it is possible to reduce an electric field due to the piezoelectric effect which would be generated in conventional light-emitting elements, and it is thereby possible to prevent non-uniformity of electronic structure in plural well layers.

SUMMARY OF THE EMBODIMENT

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A nitride semiconductor light-emitting element (1), comprising: an n-type cladding layer (30) comprising n-type AlGaN having a first Al composition ratio; and a multiple quantum well layer in which a plurality (number N) of barrier layers (52a, 52b, 52c) comprising AlGaN and having a second Al composition ratio more than the first Al composition ratio and a plurality (number N) of well layers having an Al composition ratio less than the second Al composition ratio are stacked alternately in this order, wherein the second Al composition ratio of the plurality of barrier layers (52a, 52b, 52c) of the multiple quantum well layer increases at a predetermined increase rate from an n-type cladding layer side toward an opposite side to the n-type cladding layer side.

[2] The nitride semiconductor light-emitting element (1) described in the above [1], wherein the first Al composition ratio of the n-type cladding layer (30) has a value between 50% and 60%.

[3] The nitride semiconductor light-emitting element (1) described in the above [2], wherein the second Al composition ratio of the plurality of barrier layers (52a, 52b, 52c) has a value of not less than 80%.

[4] The nitride semiconductor light-emitting element described in the above [3], wherein the increase rate has a value between 1.1% and 2.7%.

[5] The nitride semiconductor light-emitting element described in any one of the above [1] to [4], further comprising: a graded layer located between the n-type cladding layer and the multiple quantum well layer, comprising AlGaN having an Al composition ratio that increases from the n-type cladding layer side toward the multiple quantum well layer.

[6] A production method for a nitride semiconductor light-emitting element, comprising: forming an n-type cladding layer (30) comprising n-type AlGaN on a substrate (10); and forming, above the n-type cladding layer, a multiple quantum well layer in which a number N of barrier layers comprising AlGaN and having a second Al composition ratio more than the first Al composition ratio and a plurality (number N) of well layers (54a, 54b, 54c) having an Al composition ratio less than the second Al composition ratio are stacked alternately in this order, wherein the forming the plurality of barrier layers of the multiple quantum well layer is performed while increasing an Al feed rate at a predetermined increase rate from an n-type cladding layer side toward an opposite side to the n-type cladding layer side.

INDUSTRIAL APPLICABILITY

Provided is a nitride semiconductor light-emitting element of which emission output can be improved by preventing non-uniformity of electronic structure in plural well layers, and a production method for such a nitride semiconductor light-emitting element.

REFERENCE SIGNS LIST

1: nitride semiconductor light-emitting element (light-emitting element)
10: substrate
30: n-type cladding layer
40: graded layer
50: light-emitting layer
52, 52a, 52b, 52c: barrier layer
54, 54a, 54b, 54c: well layer

The invention claimed is:
1. A nitride semiconductor light-emitting element, comprising:
an n-type cladding layer comprising n-type AlGaN and having a first Al composition ratio; and
a multiple quantum well layer in which a plurality (number N) of barrier layers comprising AlGaN having a second Al composition ratio more than the first Al composition ratio and a plurality (number N) of well layers having an Al composition ratio less than the second Al composition ratio are stacked alternatively in this order,
wherein the second Al composition ratio of the plurality of barrier layers of the multiple quantum well layer increases at a predetermined increase rate from an n-type cladding layer side toward an opposite side to the n-type cladding layer side, and
wherein the increase rate has a value between 1.1% and 2.7%.
2. The nitride semiconductor light-emitting element according to claim 1, wherein the first Al composition ratio of the n-type cladding layer has a value between 50% and 60%.

3. The nitride semiconductor light-emitting element according to claim 2, wherein the second Al composition ratio of the plurality of barrier layers has a value of not less than 80%.

4. The nitride semiconductor light-emitting element according to claim 1, further comprising:
  a graded layer located between the n-type cladding layer and the multiple quantum well layer, comprising AlGaN having an Al composition ratio that increases from the n-type cladding layer side toward the multiple quantum well layer.

5. A production method for a nitride semiconductor light-emitting element, comprising:
  forming an n-type cladding layer comprising n-type AlGaN on a substrate; and
  forming a multiple quantum well layer in which a plurality (number N) of barrier layers comprising AlGaN having a second Al composition ratio more than the first Al composition ratio and a plurality (number N) of well layers having an Al composition ratio less than the second Al composition ratio are stacked alternatively in this order,
  wherein the forming the plurality of barrier layers of the multiple quantum well layer is performed while increasing an Al feed rate at a predetermined increase rate from an n-type cladding layer side toward an opposite side to the n-type cladding layer side, and
  wherein the increase rate has a value between 1.1% and 2.7%.

* * * * *